(12) United States Patent
Nakamura (10) Patent No.: US 7,018,721 B2
(45) Date of Patent: Mar. 28, 2006

(54) STRUCTURE FOR INTERCONNECTING CONDUCTORS AND CONNECTING METHOD

(75) Inventor: Satoshi Nakamura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/332,722

(22) PCT Filed: Jul. 11, 2001

(86) PCT No.: PCT/JP01/06028

§ 371 (c)(1),
(2), (4) Date: Jan. 8, 2003

(87) PCT Pub. No.: WO02/05609

PCT Pub. Date: Jan. 17, 2002

(65) Prior Publication Data

US 2003/0143419 A1    Jul. 31, 2003

(30) Foreign Application Priority Data

Jul. 12, 2000    (JP)    ............................. 2000-248000

(51) Int. Cl.
*B32B 15/04* (2006.01)
*B32B 15/20* (2006.01)
*B23K 1/00* (2006.01)
*B23K 20/00* (2006.01)

(52) U.S. Cl. ...................... 428/646; 428/671; 428/674; 428/336; 428/213; 428/658; 228/193; 228/262.61

(58) Field of Classification Search ................ 428/672, 428/658, 646, 647, 671, 674, 213, 336, 901; 174/261, 268, 137 A, 263; 228/193, 194, 228/195, 262.6, 262.61, 262.7; 257/772; 403/272; 148/528

See application file for complete search history.

(56) References Cited

U.S. PATENT DOCUMENTS

| | | | |
|---|---|---|---|
| 5,942,185 A * | 8/1999 | Nakatsuka et al. | 420/562 |
| 6,011,313 A * | 1/2000 | Shangguan et al. | 257/778 |
| 6,358,630 B1* | 3/2002 | Tsukada et al. | 420/646 |
| 6,361,626 B1* | 3/2002 | Kitajima et al. | 148/400 |
| 6,457,632 B1* | 10/2002 | Teshima et al. | 228/246 |
| 6,503,338 B1* | 1/2003 | Taguchi et al. | 148/23 |
| 2002/0029473 A1* | 3/2002 | Kwoka et al. | 29/885 |
| 2003/0007885 A1* | 1/2003 | Domi et al. | 420/557 |

FOREIGN PATENT DOCUMENTS

| | | |
|---|---|---|
| DE | 26 50 348 A1 | 5/1978 |
| EP | 0 875 331 A2 | 11/1998 |
| EP | 1 009 202 A1 | 6/2000 |
| JP | 59-189096 | 10/1984 |
| JP | 05-283446 | * 10/1993 |
| JP | 08-164496 | * 6/1996 |
| JP | 09-206983 | 8/1997 |
| JP | 10-193170 | 7/1998 |
| JP | 11-245083 | 9/1999 |

\* cited by examiner

*Primary Examiner*—Michael E. Lavilla
(74) *Attorney, Agent, or Firm*—Hamre, Schumann, Mueller & Larson, P.C.

(57) ABSTRACT

A first conductor having an Au layer formed on the surface is connected with a second conductor at least the surface of which has conductivity through a solder containing Zn. The first conductor is, for example, a terminal pad (11a, 11b, 11c) constituting a part of a wiring pattern on a circuit board (1), and the second conductor is, for example, a terminal (20a, 21a) or a terminal board (22) of an electronic component (20 21). The first conductor is connected with the second conductor through an Au—Zn alloy layer formed through diffusion of Zn from the solder containing Zn into the Au layer of the first conductor.

13 Claims, 9 Drawing Sheets

STRUCTURE FOR INTERCONNECTING CONDUCTORS AND CONNECTING METHOD

The patent or application file contains at least one drawing executed in color. Copies of this patent or patent application publication with color drawing(s) will be provided by the Office upon request and payment of the necessary fee.

1. Technical Field

The present invention relates to a technique for connecting a conductor having a surface formed with an Au layer with another conductor via a solder.

2. Background Art

Conventionally, as a method for mounting an electronic component such as a semiconductor chip to a circuit board for example, a terminal of the electronic component is electrically and mechanically connected to a terminal pad provided on the circuit board via a solder. Such a terminal pad of a circuit board may be provided, for example, by forming a Cu wiring pattern on the circuit board and then laminating an Ni-plating layer and an Au-plating layer at a portion to become the terminal pad. The Au-plating layer is provided as the uppermost layer to prevent the surface of the terminal pad from oxidizing to provide a reliable connection with the terminal of the electronic component. The Ni-plating is provided because it is difficult to directly provide the Au-plating on the Cu wiring pattern and because Ni itself is likely to oxidize at the surface thereof.

Conventionally, for the solder, a 63Sn-37Pb solder is generally used. Recently, however, by environmental regulations such as the Waste Disposal Act, Pb is designated as a substance for special control, and the influence of Pb on the environment is worried about. For this reason, the conventionally used solder is being replaced with a solder which does not contain Pb (Pb-free solder).

As a promising Pb-free solder, attention is focused on an Sn—Ag solder, and an Sn—Ab based solder which further contains Cu or Bi. When an electronic component is connected to a circuit board having the above-described structure using such an Sn—Ag based solder, the Sn atoms in the solder layer diffuse into the Ni-plating layer to form an Sn—Ni alloy layer. Through the alloy layer and the solder layer, the terminal of the circuit board is connected to the terminal of the electronic component.

In this case, the Au-plating layer formed on the surface of the Ni-plating layer breaks, diffusing Au into the solder layer. Since Au and Sn are highly reactive with each other, these elements are bonded to form an intermetallic compound. The Au—Sn intermetallic compound deteriorates the mechanical strength of the solder layer. For example, it is said that the connection strength largely deteriorates when the concentration of the Au—Sn intermetallic compound in the entire solder layer becomes about 5 wt % or when the Au—Sn intermetallic compound is locally formed to have a local concentration of about 5 wt %. Therefore, there exists even a report which concludes that another conductor cannot be connected to an Au-plating layer using a solder. Particularly, when an Au-plating layer is formed by electrolytic plating, the thickness of the Au-plating layer is relatively large, so that a relatively large amount of Au diffuses in the solder layer. In such a case, the concentration of the Au—Sn intermetallic compound in the solder layer is high, so that the problem as to the connection strength is more serious.

Therefore, an attempt is also made to connect a terminal pad of a circuit board to a terminal of an electronic component via a solder without forming an Au-plating layer on the terminal pad (or, in some cases, even without forming an Ni-plating layer). However, the surface of such a terminal pad at which the Ni-plating layer or the Cu wiring is exposed is likely to oxidize due to the heat in soldering, which deteriorates the connection reliability of the electronic component. To solve these problems, solder bonding may be performed in an inert atmosphere by feeding an inert gas, which is, however, disadvantageous in terms of cost.

Moreover, in a circuit board for use as a protective circuit of a rechargeable battery of a mobile phone for example, an additional terminal pad for direct contact with a terminal of a battery or a terminal of a charger need be formed besides the terminal pad for mounting an electronic component (mounting terminal pad). Since such an additional terminal pad is to be exposed in the air for a long period of time, the surface thereof is usually plated with gold for preventing the oxidization. Therefore, to provide a mounting terminal pad which is not provided with Au-plating, the mounting terminal pad need be covered with a mask and the mask need be removed after the completion of the plating. Such process steps deteriorate the manufacturing efficiency while increasing the cost. Particularly when the Au-plating is provided by electrolytic plating, the mounting terminal pad need be selectively formed with a mask, which deteriorates the manufacturing efficiency more largely. Therefore, in view of the cost, in a circuit board for use as a protective circuit or the like, it is expedient to apply Au-plating simultaneously to the mounting terminal pad and to the additional terminal pad.

DISCLOSURE OF THE INVENTION

An object of the present invention, which is conceived under the circumstances described above, is to provide a technique for connecting a conductor having a surface formed with an Au layer with another conductor via a solder in a cost-effective manner and with a high connection reliability.

According to a first aspect of the present invention, there is provided a connection structure comprising a first conductor having a surface formed with an Au layer, a second conductor which is conductive at least at a surface thereof, and a solder for connecting the first conductor to the second conductor, the first conductor being connected to the second conductor via an Au—Zn alloy layer.

Preferably, the first conductor includes a conductor layer having an obverse surface formed with an Au-plating layer, and the Au—Zn alloy layer joins the conductor layer to a layer of the solder formed at the second conductor. The Au—Zn alloy layer may have a thickness of 0.1~10 µm, for example.

Preferably, the solder layer comprises an Sn—Zn alloy layer. It is particularly preferable that the Sn—Zn alloy layer contains Sn and Zn generally at a eutectic alloy ratio, because such an alloy has a low melting point.

The Sn—Zn alloy layer may further contain Bi. In such a case, the Sn—Zn—Bi alloy layer may have a composition of Sn:Zn:Bi=85~95:8~12:1~10, for example.

In a preferred embodiment, the first conductor may comprise a Cu layer, an Ni layer and an Au layer which are successively laminated.

According to a second aspect of the present invention, there is provided a method for connecting a first conductor having a surface formed with an Au layer to a second conductor which is conductive at least at a surface thereof via solder. The method, includes the steps of interposing a solder containing Zn between the first conductor and the second conductor, melting the solder, and then solidifying the solder.

Preferably, the solder may be an Sn—Zn eutectic solder. The Sn—Zn eutectic solder may further contain Bi. In such a case, the solder has a composition of Sn:Zn:Bi=85~95: 8~12:1~10.

The Au layer has a thickness of 0.1~10 μm, for example. The Au layer may be formed by electrolytic plating, for example.

In a preferred embodiment, the first conductor may comprise a Cu layer, an Ni layer and an Au layer which are successively laminated. The first conductor maybe a terminal pad of a circuit board, whereas the second conductor may be a terminal of an electronic component or a conductor plate.

Other features and advantages of the present invention will become clearer from the description of the embodiments given below with reference to the accompanying drawings.

BRIEF DESCRIPTION OF THE DRAWINGS

FIG. 4 are mappings showing the results of EPMA of the connection section when Sn-8Zn-3Bi solder is used, FIG. 4a being a monochromatic mapping photograph simultaneously showing the concentration profiles of all components, FIG. 4b being a color mapping photograph showing the concentration profile of Sn, FIG. 4c being a color mapping photograph showing the concentration profile of Zn, FIG. 4d being a color mapping photograph showing the concentration profile of Bi, FIG. 4e being a color mapping photograph showing the concentration profile of Cu, FIG. 4f being a color mapping photograph showing the concentration profile of Ni, and FIG. 4g being a color mapping photograph showing the concentration profile of Au.

BEST MODE FOR CARRYING OUT THE INVENTION

Other features and advantages of the present invention will become clearer from the description given below with reference to the accompanying drawings.

Figure 1:
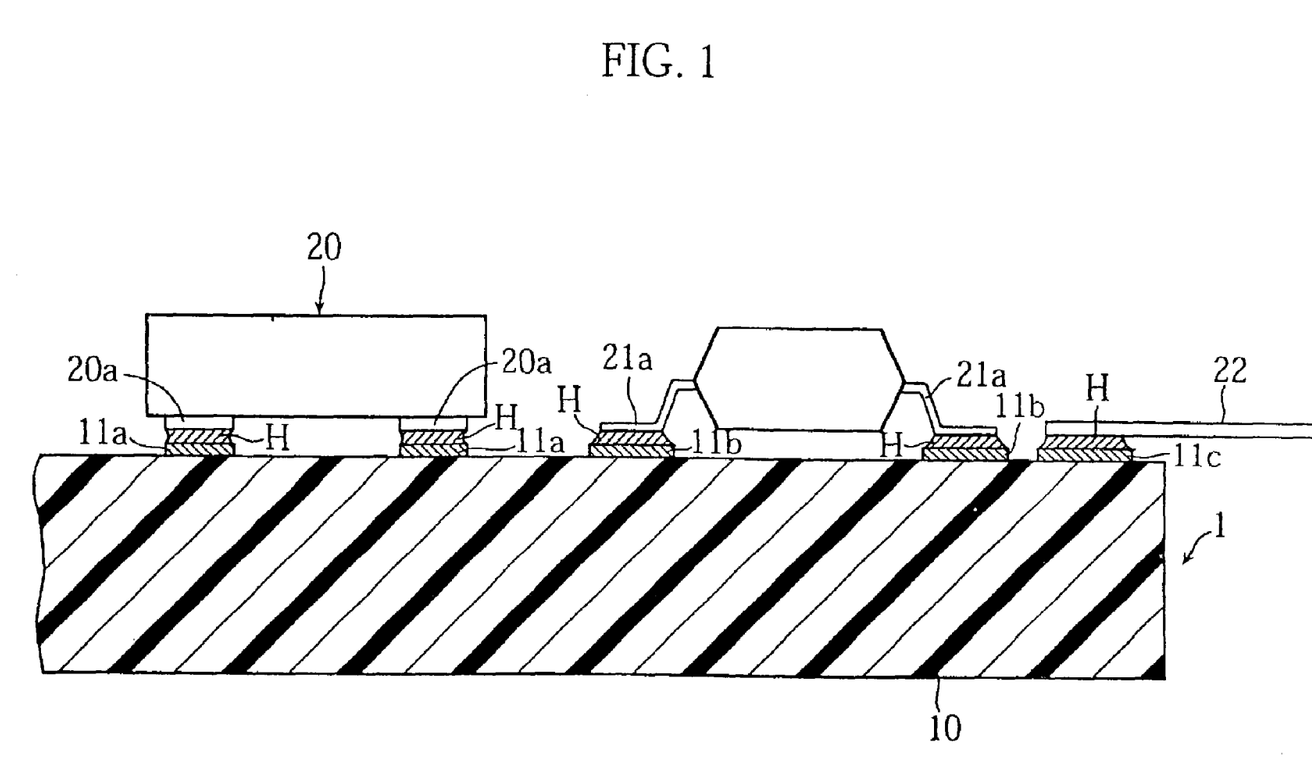
FIG. 1 is a sectional view illustrating a connection structure of electronic components to a circuit board as an embodiment of the connection structure of conductors according to the present invention.

A preferred embodiment of the present invention will be described below in detail with reference to FIG. 1. FIG. 1 is a sectional view illustrating a connection structure of conductors according to an embodiment of the present invention.

In FIG. 1, a circuit board 1 includes a protective circuit for preventing the overcharge of a rechargeable battery for example. The circuit board 1 comprises a substrate 10 formed of, for example, glass-fiber-reinforced epoxy resin, and a wiring pattern (not shown) of Cu formed on the substrate. The Cu wiring pattern may be provided by forming a Cu film having a thickness of about 15~25 μm entirely on a surface of the substrate 10 by CVD or vapor deposition for example and then removing unnecessary portions by etching.

The Cu wiring pattern is provided, at appropriate portions thereof, with a plurality of terminal pads 11a, 11b, 11c to which terminals 20a, 21a of electronic components 20, 21 and a terminal plate 22 are connected. Each of the terminal pads 11a, 11b and 11c may be made by forming an Ni-plating layer at a pad-forming portion on the Cu-wiring pattern and then forming an Au-plating layer thereon. The Ni-plating layer may be formed, for example, by electrolytic plating to a thickness of about 10 μm. The Au-plating layer may be formed, for example, by electrolytic plating or electroless plating to a thickness of 0.1~10 μm, and more preferably, to a thickness of 0.5~5 μm.

To the circuit board 1 having such a structure, the electronic components 20, 21 and the terminal plate 22 are mounted utilizing solders H. In the illustrated embodiment, the electronic component 20 is a bear chip, whereas the electronic component 21 is a semiconductor device 21 of a resin-packaged type. The terminal plate 22 may be made of nickel for example. The kind of components to be mounted to the circuit board 1 is not limitative. For example, a semiconductor device of a pin insertion type or a chip resistor may be mounted to the circuit board 1. The mounting to the circuit board 1 may be performed as follows.

First, solder paste is printed on the terminal pads 11a, 11b, 11c of the circuit board 1, the terminals 20a, 21a of the electronic components 20, 21 and a predetermined portion of the terminal plate 22 in advance. Alternatively, solder plating may be applied to these portions.

The solder to be used in this embodiment is not limited as long as it contains Zn. For example, use may be made of a solder containing Zn only, or of a solder containing selected one or ones of Pb, Sn, Cu and Bi in addition to Zn. Among these solders, an Sn—Zn eutectic solder may suitably be used in view of its Pb-free feature and low melting point. Herein, the Sn—Zn eutectic solder means a solder containing Sn and Zn at the ratio which makes the solder eutectic or at a ratio close to that ratio. The solder may further contain Bi or Cu as the third component. More specifically, it is preferable that the Cu—Zn eutectic solder contains Sn, Zn and Bi at the weight ratio of Sn:Zn:Bi=85~95:8~12: 1~10. Note that, since the eutectic point of Sn—Zn is about 199° C., the melting point of such an Sn—Zn solder containing a third component is about 200° C.

Subsequently, each of the electronic components 20, 21 and the terminal plate 22 is electrically and mechanically connected to the circuit board 1. Specifically, the circuit board 1 at appropriate positions of which the electronic components 20 and the like are disposed is put into a reflow furnace heated to a temperature equal to or higher than the melting point of the solder for re-melting the solders H. Then, the circuit board 1 is taken out from the reflow furnace and the solders H are cooled for solidification. In this way, each of the electronic components 20, 21 and the terminal plate 22 is mounted to the circuit board 1.

As described above, the melting point of the Sn—Zn eutectic solder is about 199° C. Therefore, when the Sn—Zn eutectic solder is used, a temperature of about 240° C., for example, is sufficient as the temperature of the reflow furnace. Such a temperature is generally equal to the temperature of a reflow furnace conventionally used for reflow soldering using Sn—Pb solder for providing electric connection. Such a temperature is also sufficiently low so that the electronic components are not damaged by heat. Therefore, when the Sn—Zn eutectic solder is used, the electronic components 20, 21 and the terminal plate 22 or the like can be mounted and connected to the circuit board 1 by reflow soldering using the existing equipment (i.e., without preparing new equipment) and without causing much thermal damage to the electronic components.

When the Sn—Zn eutectic solder is used in this embodiment, the electronic components 20, 21 and the terminal plate 22 are connected to the terminal pads 11a, 11b, 11c each including an Au-plating layer via the solders H containing Sn. Therefore, from the conventional common knowledge, one may afraid that, similarly to the case where an Sn—Ag based solder is used, Au atoms may diffuse in the solder H to form an Au—Sn intermetallic compound, resulting in a decrease in the connection strength. However, as will be described below, the inventor of the present invention has found that the connection structure provided by using the Sn—Zn eutectic solder has sufficient mechanical stability.

To confirm the mechanical stability of the connection structure using the Sn—Zn eutectic solder, two kinds of samples were prepared. One sample I included a Cu wiring pattern (having a thickness of about 20 μm) formed on a substrate made of glass-fiber-reinforced epoxy resin. The Cu wiring pattern was formed with a terminal pad comprising an Ni-plating layer (having a thickness of about 10 μm) and an Au-plating layer (having a thickness of about 0.8 μm). To the terminal pad, a terminal plate formed of Ni was connected by reflow soldering using an Sn-8Zn-3Bi solder (Sn:Zn:Bi=89:8:3 by weight ratio) which was an Sn—Zn eutectic solder. The other sample II included a Cu wiring pattern to which a terminal plate formed of Ni was directly connected by reflow soldering using 63Sn-37Pb solder (Sn:Pb=63:37 by weight ratio) which was an Sn—Pb eutectic solder. The two kinds of samples were the same with respect to the conditions other than the kind of a solder, the condition of the applying of the solder, the structure of a terminal pad of the circuit board. (For example, they were the same with respect to the reflowing temperature and the shape of the terminal plate).

Specifically, a plurality of such samples I and a plurality of such samples II were prepared. With respect to each of these samples, the connection strength between the terminal plate and the circuit board was measured by applying a vertical load to the terminal plate to pull the plate for removal from the board and measuring the load when the terminal plate was removed. As a result, each of the samples I was found to have a connection strength which is generally equal to or higher than that in each of the samples II. From this result, the inventor of the present invention surmised that the Zn component contained in the Sn—Zn eutectic solder functioned to prevent Au atoms of the Au-plating layer from diffusing in the solder layer. To confirm this, the inventor analyzed the sectional structure and composition between a circuit board and a terminal pad with respect to the case where the connection between the terminal plate and the circuit board was made using a solder containing Zn and the case where such connection was made using a solder which did not contain Zn.

Figure 2A:
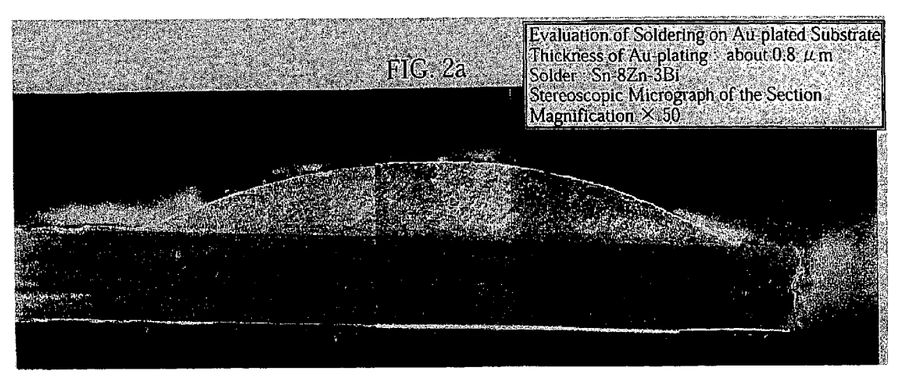
FIG. 2a is a micrograph showing the condition of the connection section when Sn-8Zn-3Bi solder is used.
Figure 2B:
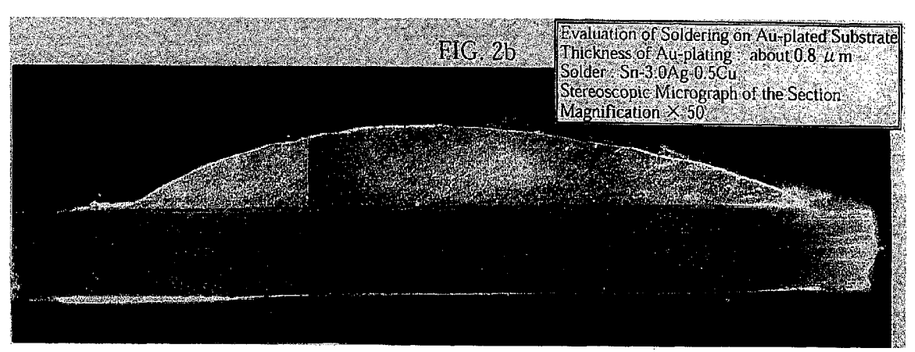
FIG. 2b is a micrograph showing the condition of the connection section when Sn-3.0Ag-0.5Cu solder is used.

First, using a solder, the inventor connected a terminal plate formed of Ni to a circuit board having a structure similar to the above-described embodiment (in which the Cu wiring pattern had a thickness of about 20 μm, the Ni-plating layer had a thickness of about 10 μm, the Au-plating layer had a thickness of about 0.8μm), and then removed the terminal plate, thereby providing a circuit board having a terminal pad to which the solder is fixed. With respect to such a circuit board, the section at the terminal pad (hereinafter referred to as "connection section") was polished, and the connection section was checked using an optical microscope (Tradename: SZ-60, Supplier: Olympus Optical Co., Ltd.). FIGS. 2a and 2b (color micrographs) show the conditions of connection sections as magnified 50 times. FIG. 2a shows the condition of the connection section when Sn-8Zn-3Bi solder is used, whereas FIG. 2b shows the condition of the connection section when Sn-3.0Ag-0.5Cu (Sn:Ag:Cu=96.5:3.0:0.5 by weight ratio) is used. Although objects like a Cu-wiring pattern and a solder layer were seen on the substrate in each figure, no clear difference of the condition of the connection section was found between the case where the solder containing Zn was used (FIG. 2a) and the case where the solder which did not contain Zn was used (FIG. 2b).

Subsequently, the inventor performed component analysis of the connection section two-dimensionally by EPMA (electron probe microanalysis). FIGS. 3a~3f are mappings showing concentration profiles at the connection section when Sn-3.0Ag-0.5Cu solder is used, whereas FIGS. 4a~4f are mappings showing concentration profiles at the connection section when Sn-8Zn-3Bi solder is used. The EPMA was performed using "EPMA 8705" of Shimadzu Corporation.

Figure 3A:
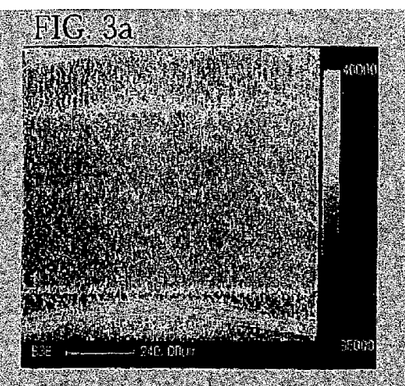
FIGS. 3a~3f are mappings showing the results of EPMA of the connection section when Sn-3.0Ag-0.5Cu solder is used, FIG. 3a being a monochromatic mapping photograph simultaneously showing the concentration profiles of all components, FIG. 3b being a color mapping photograph showing the concentration profile of Sn, FIG. 3c being a color mapping photograph showing the concentration profile of Ag, FIG. 3d being a color mapping photograph showing the concentration profile of Cu, FIG. 3e being a color mapping photograph showing the concentration profile of Ni, and FIG. 3f being a color mapping photograph showing the concentration profile of Au.

FIG. 3a is a monochromatic mapping photograph of the concentration profile of all the components when the connection is made using Sn-3.0Ag-0.5Cu solder. This photograph shows the distribution region of each of the components.

Figure 3B:
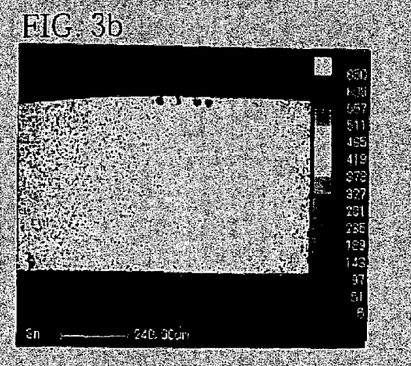
Figure 3C:
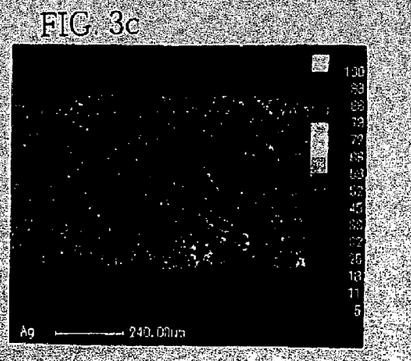
Figure 3D:
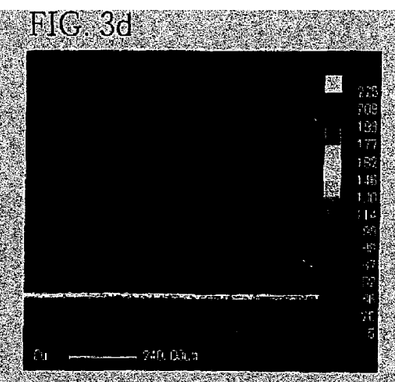

FIGS. 3b~3d are color mapping photographs of respective concentration profiles of Sn elements, Ag elements and Cu elements constituting the Sn-3.0Ag-0.5Cu solder. From the comparison of these figures with FIG. 3a, it is confirmed that the solder layer consists of Sn elements, Ag elements and Cu elements. Since Cu elements are the component constituting the Cu wiring pattern, the region where the Cu concentration is high is found on the substrate. Further, it is also confirmed that part of Sn leaves the solder layer to diffuse in the Cu wiring pattern.

Figure 3E:
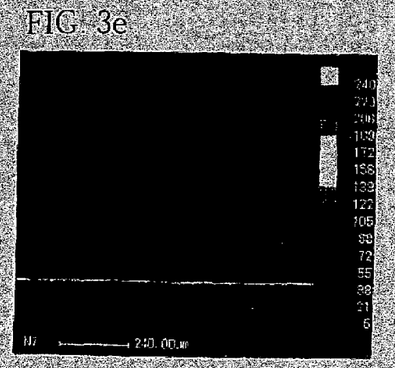

FIG. 3e shows the concentration profile of Ni elements. From the comparison of this figure with FIG. 3a, it is found that most of the Ni elements remain on the Cu wiring pattern, while some of the Ni elements have diffused into the solder layer. Since the region where the Ni concentration is high generally coincides with the region to which the Sn elements from the solder layer is distributed, it is surmised that Sn has diffused into the Ni plating layer to form an Sn—Ni alloy layer on the Cu wiring pattern.

Figure 3F:
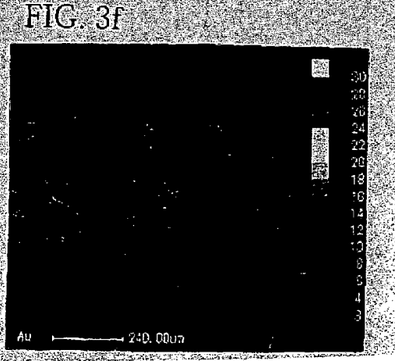

FIG. 3f shows the concentration profile of Au elements. From the comparison of this figure with FIG. 3a, it is confirmed that Au has diffused in the solder layer. Since a band-like region of a high Au concentration is not seen, it is considered that the Au-plating layer has broken.

Figure 4A:
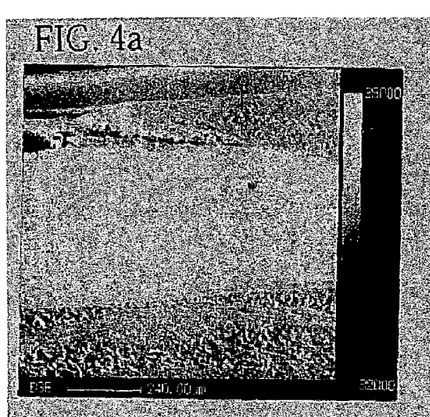

FIG. 4a is a monochromatic mapping photograph of the concentration profile of all the components when the connection is made using Sn-8Zn-3Bi solder. This photograph shows the distribution region of each of the components.

Figure 4B:
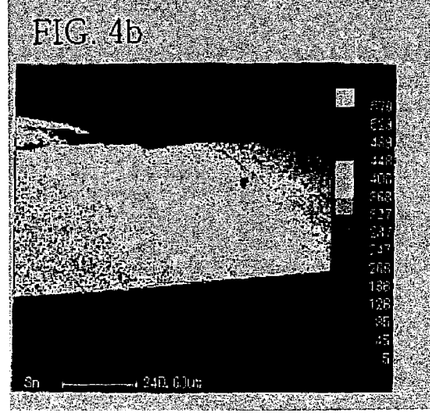
Figure 4C:
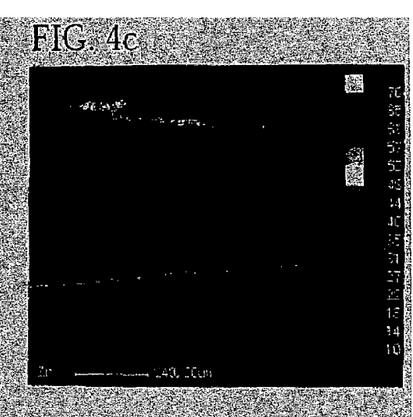
Figure 4D:
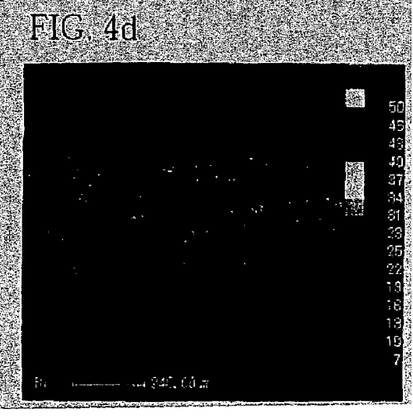

FIGS. 4b~4d are color mapping photographs of respective concentration profiles of Sn elements, Zn elements and Bi elements constituting the Sn-8Zn-3Bi solder. From the comparison of these figures with FIG. 4a, it is confirmed that the solder layer consists of Sn elements, Zn elements and Bi elements and that a region where the Zn concentration is high is formed at a lower region of the solder layer or separately from the solder layer.

Figure 4E:
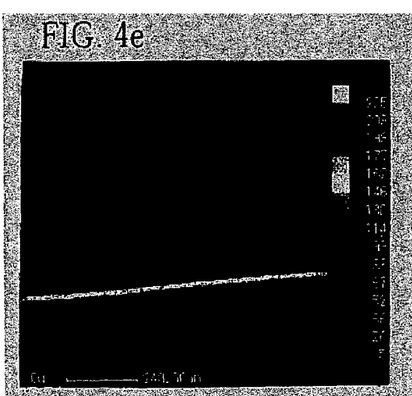

FIG. 4e shows the concentration profile of Cu elements. From the comparison of this figure with FIG. 4a, it is surmised that most of Cu elements remain on the substrate to form the Cu wiring pattern while some of the Cu elements have diffused in the solder layer.

Figure 4F:
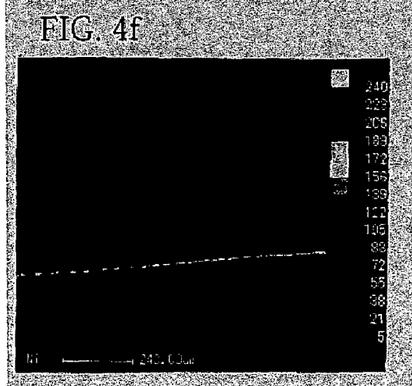

FIG. 4f shows the concentration profile of Ni elements. From the comparison of this figure with FIGS. 4a and 4e, it is surmised that most of the Ni elements remain on the Cu wiring pattern to form the Ni-plating layer while some of the Ni elements have diffused in the solder layer.

Figure 4G:
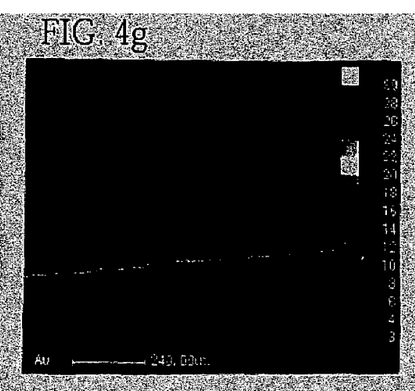

FIG. 4g shows the concentration profile of Au elements. From the comparison of this figure with FIGS. 4a and 4f, it is surmised that Au has hardly diffused in the solder layer and most of the Au elements remain on the Ni plating layer.

As described above, it is confirmed that when connection to a terminal pad including an Au-plating layer is made using an Sn-3.0Ag-0.5Cu solder which does not contain Zn, the Au-plating layer breaks to diffuse the Au elements into the solder layer. On the other hand, it is also confirmed that Au hardly diffuses in the solder layer when an Sn-8Zn-3Bi solder, which contains Zn, is used. What should be noted particularly is that, as can be confirmed from FIGS. 4c and 4g, when the Sn-8Zn-3Bi solder is used, the region where the Zn concentration is high generally coincides with the region where the Au concentration is high. This fact indicates that Zn has diffused in the Au plating layer to form an Au—Zn layer or that a Zn layer is formed on the Au layer to prevent Au atoms from diffusing into the solder layer. In any case, there is no doubt that the diffusion of Au contained in the Au plating layer is suppressed by Zn contained in the solder.

Therefore, by using another method, the inventor analyzed the connection section and the composition with respect to the case where an Sn-8Zn-3Bi solder is used.

Figure 5:
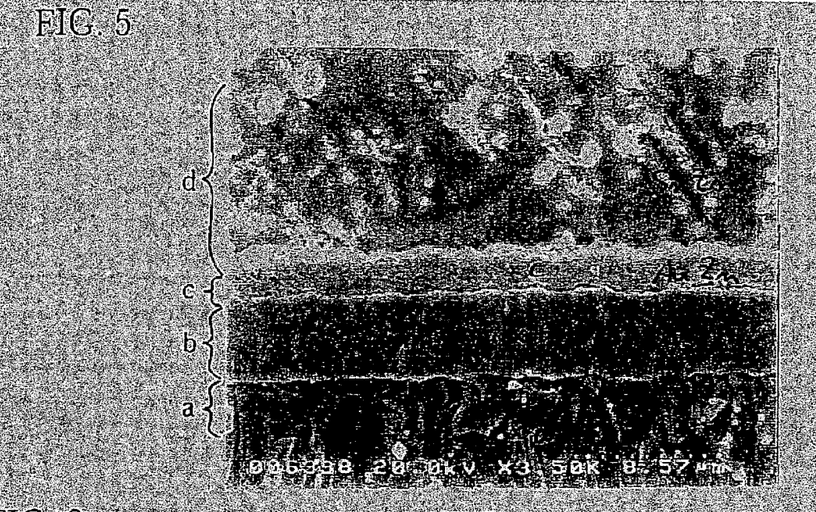
FIG. 5 is a micrograph showing, as enlarged, the connection section when Sn-8Zn-3Bi solder is used

First, the inventor checked the structure of the connection section by magnifying 3500 times using "S-4000" of Hitachi, Ltd. FIG. 5 shows the photograph. As is clear from the photograph, the connection section consists of four layers, i.e. layers a~d. In view of the results of the concentration analysis for each component by EPMA (FIGS. 4a~4g), three of these layers are presumably a Cu wiring pattern, an Ni-plating layer and a solder layer, respectively. Therefore, since the remaining layer is only one, it is considered that Zn does not solely form a layer but Zn together with Au form the one layer.

To confirm this, composition analysis was performed for each of the layers a~d by electron diffraction (ED) analysis. The electron diffraction was performed using "EMAX2770" manufactured by Horiba, Ltd. FIGS. 6a~6d each is a color chart photograph showing the result of the composition analysis of each layer. It is to be noted that, although tungsten appears as a peak W in each color chart photograph, this is not a component constituting each layer but just appears because it is used for coating the surface of a connection section in analysis.

Figure 6A:
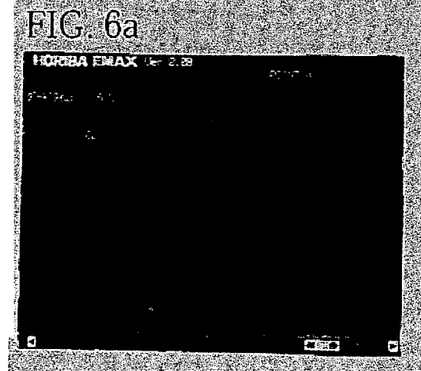
FIGS. 6a~6d are color chart photographs showing the results of the composition analysis of the layers a, b, c and d in FIG. 5, respectively.

FIG. 6a is a chart showing the result of the composition analysis of the layer a. From the fact that most of the detected structural elements of the layer a are Cu, the layer a is concluded to be a Cu wiring pattern as surmised.

Figure 6B:
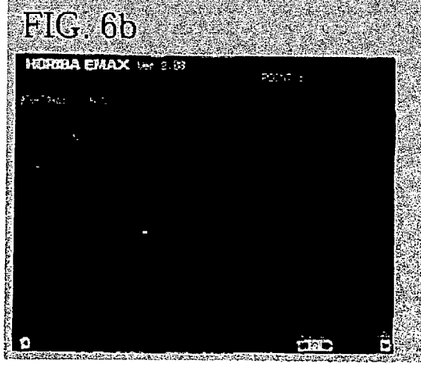

FIG. 6b is a chart showing the result of the composition analysis of the layer b. Much Ni is detected as a structural element of the layer b, though C is also detected. From this result, the layer b is concluded to be an Ni-plating layer as surmised.

Figure 6C:
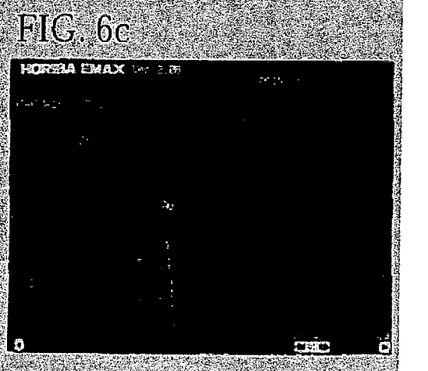

FIG. 6c is a chart showing the result of the composition analysis of the layer c. As the structural elements of the layer c, Au and Zn are mainly detected. Therefore, it is considered that the layer c is not a Zn layer solely composed of Zn but an Au—Zn alloy layer formed on the Ni-plating layer. It is probable that the Zn elements in the layer c have come from the solder material. Therefore, it is considered that the Au—Zn alloy layer has formed based on the Au-plating layer as a result of the diffusion of Zn into the Au-plating layer during the solder reflowing process while preventing the diffusion of Au toward the solder layer.

Figure 6D:
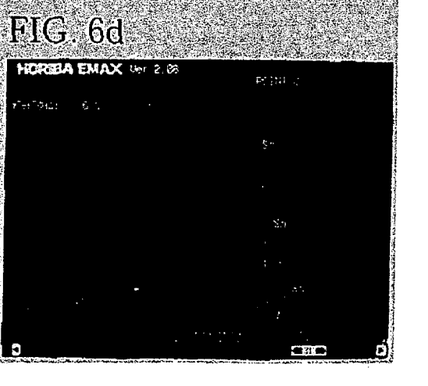

FIG. 6d is a chart showing the result of the composition analysis of the layer d. As the structural elements of the layer d, Sn and Zn are detected. In view of this result together with the measurements of the concentration profile of Bi by EMPA shown in FIG. 4d, the layer d is concluded to be a solder layer consisted of Sn, Zn and Bi. Au is hardly detected in the layer d, which means that Au constituting the Au-plating layer has hardly diffused in the solder layer. The reasons why Bi does not appear in FIG. 6d as a recognizably high peak is that the content of Bi in the solder material is 3 wt (one twentieth of Sn) at the most and that the measurement range is set based on Sn.

As described above, the composition of each layer a~d is generally determined from the results of the electron diffraction analysis. This analysis is particularly meaningful in that the layer c is generally concluded to be an Au—Zn alloy layer and that Au has not been detected in the layer d (solder layer).

To further confirm the surmise obtained from the results of the electron diffraction analysis, the inventor analyzed the concentration profile of each component at the connection section by Auger electron spectroscopy (AES) analysis, which is a more precise analyzing method.

Figure 7:
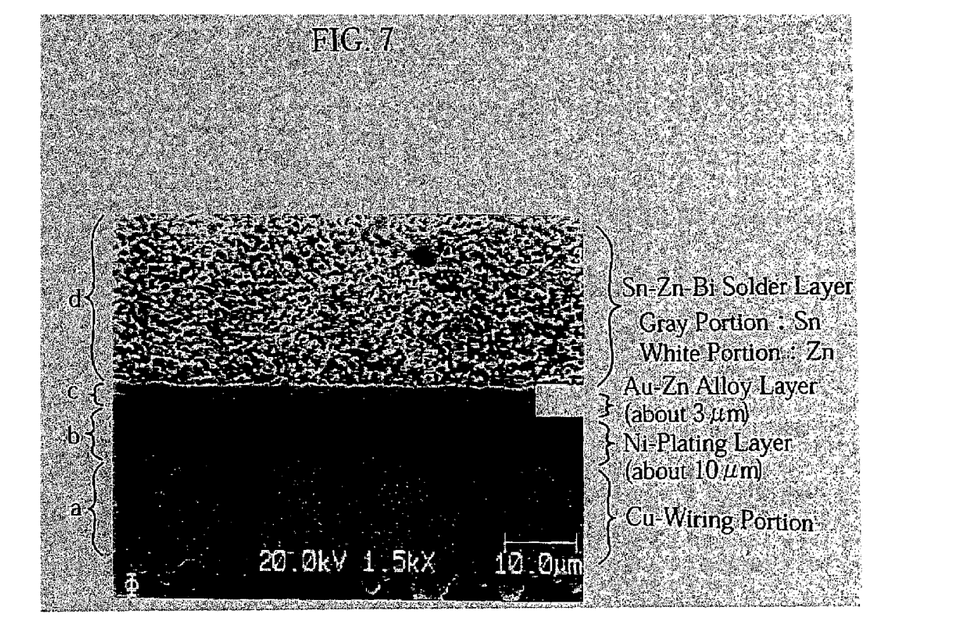
FIG. 7 is an SEM photograph showing, as enlarged, the connection section when Sn-8Zn-3Bi solder is used.

First, the configuration of the connection section to be subjected to the Auger electron spectroscopy analysis is checked using an SEM (scanning electron microscope). FIG. 7 shows the SEM photograph, which confirms that the connection section includes four layers (layers a~d) which are supposed to be a Cu wiring pattern, an Ni-plating layer, an Au—Zn alloy layer and an Sn—Zn—Bi solder layer, respectively.

Subsequently, the concentration profiles at the region shown in the SEM photograph of FIG. 7 are measured by Auger electron spectroscopy analysis using "Auger PHI680" manufactured by Ulvac-phi Incorporated. The results are given in FIGS. 8a~8e as monochromatic mapping photographs. It is to be noted that, with respect to Bi, the result of the Auger electron spectroscopy analysis is not given because its concentration profile cannot be measured due to the low content.

Figure 8A:
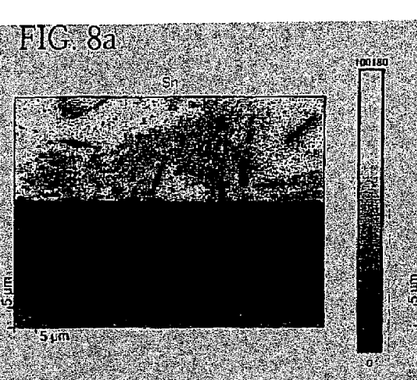
FIG. 8 are monochromatic mapping photographs showing the results of the Auger analysis of the concentration profile of each component in the region corresponding to the SEM photograph of FIG. 7.

FIG. 8a is a mapping photograph showing the measurements of the concentration profile of Sn. From this photograph, it is found that Sn is distributed to the region corresponding to the layer d. This result coincides with the results of the EPMA and the electron diffraction analysis.

Figure 8B:
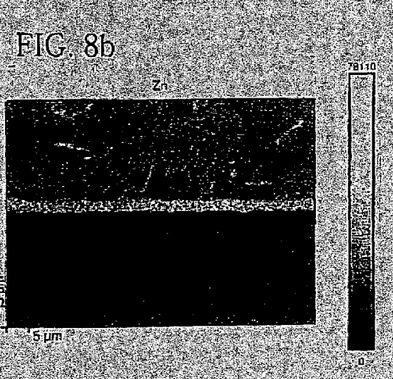

FIG. 8b is a mapping photograph showing the measurements of the concentration profile of Zn. From this photograph, it is found that Zn is distributed to the region corresponding to the layer d and that a region of a high Zn concentration exists in the layer c. This result also coincides with the results of the EPMA and the electron diffraction analysis. By considering this result together with FIG. 8a, the layer d is concluded to be an Sn—Zn alloy layer. From the result of the EPMA, it is clear that Bi is diffused in the layer d. Therefore, there is no doubt that the layer d is an Sn—Zn—Bi solder layer.

Figure 8C:
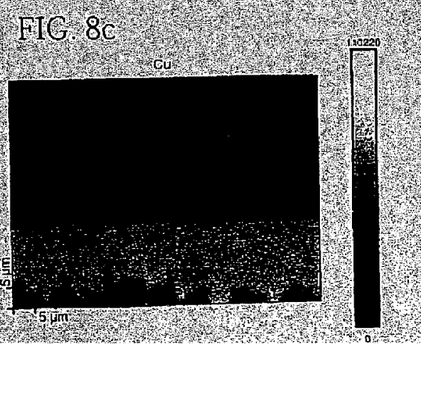

FIG. 8c is a mapping photograph showing the measurements of the concentration profile of Cu. From this photograph, it is found that Cu is distributed to the region corresponding to the layer a. This result coincides with the results of the EPMA and the electron diffraction analysis. Therefore, there is no doubt that the layer a is a Cu wiring pattern.

Figure 8D:
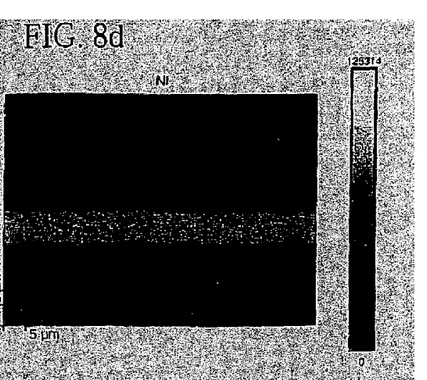

FIG. 8d is a mapping photograph showing the measurements of the concentration profile of Ni. From this photograph, it is found that Ni is distributed to the region corresponding to the layer b. This result coincides with the results of the EPMA and the electron diffraction analysis. Therefore, there is no doubt that the layer b is an Ni-plating layer.

Figure 8E:
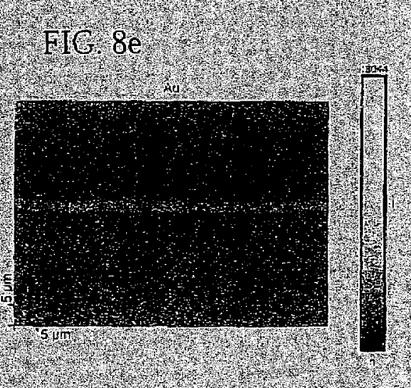

FIG. 8e is a mapping photograph showing the measurements of the concentration profile of Au. From this photograph, it is found that Au is distributed to the region corresponding to the layer c. Since Au is an element which is difficult to measure, the measurement is performed with an increased sensitivity. Therefore, the photograph shows entirely whitish as if Au is distributed to the entire region. In fact, however, Au is distributed to the layer c only. By considering this result together with FIG. 8b, there is no doubt that the layer c is an Au—Zn alloy layer. From the fact that an Au-plating layer is originally formed on an Ni-plating layer, it is concluded that the Au—Zn alloy layer is formed as a result of the diffusion of Zn, which is a component of the solder, into the Au plating layer. From the SEM photograph shown in FIG. 7, the layer c, i.e. the Au—Zn alloy layer is found to have a thickness of about 2~3 µm, although the Au plating layer originally had a thickness of about 0.8 µm. Therefore, it is surmised that the ratio of Au to Zn in the Au—Zn alloy layer is about 1:1~3.

The following is apparent from the results of the various kinds of analysis described above. The connection structure between the substrate and the terminal plate comprises a Cu wiring pattern, an Ni-plating layer, an Au—Zn alloy layer and an Sn—Zn—Bi solder layer. The Au—Zn alloy layer is interposed between the Ni-plating layer and the solder layer. The Au—Zn alloy layer functions to bond the solder to the terminal pad. Since Ni is compatible with Au, the Au—Zn alloy layer is reliably bonded to the Ni-plating layer. Further, since Au and Sn have a good affinity with each other and both the Au—Zn alloy layer and the solder layer contain Zn, reliable bonding is provided also between the Au—Zn alloy layer and the solder layer. Therefore, with the connection structure wherein an Au—Zn alloy layer is interposed between the Ni-plating layer and the Sn—Zn solder layer, high mechanical strength is obtained. As described before, this fact is confirmed also from the measurements in the tearing-off test performed for measuring the connection strength between a terminal plate and a circuit board.

Moreover, Au is hardly diffused in the solder layer. This is because the diffusion of Au is prevented by the Au—Zn alloy layer which is formed as a result of the diffusion of Zn into the Au-plating layer. That is, Zn has a function to prevent Au constituting the Au-plating layer from diffusing into the solder layer. The prevention of the Au diffusion leads to the prevention of the generation of an Au—Sn intermetallic compound in the solder layer. Conventionally, it is said that to strongly connect a conductor (e.g. a terminal pad) provided with Au-plating to another metal using solder containing Sn is difficult, because Au together with Sn forms an intermetallic compound in the solder layer, which weakens the solder layer. According to the present invention, however, by utilizing a solder containing Zn such as an Sn—Zn eutectic solder, the formation of an Au—Sn intermetallic compound is prevented so that strong connection is provided between a conductor provided with Au-plating and another metal.

The invention claimed is:

1. A connection structure comprising a first conductor having a surface formed with an Au layer, a second conductor which is conductive at least at a surface thereof, and a solder for connecting the first conductor to the second conductor;
    wherein the solder is Pb-free and Cu-free, and comprises Sn and Zn;
    wherein the first conductor is connected to the second conductor via an Au—Zn alloy layer formed between the solder and the first conductor; and
    wherein the solder further contains Bi.

2. The connection structure according to claim 1, wherein said Au layer is an Au-plating layer.

3. The connection structure according to claim 1, wherein the Au—Zn alloy layer has a thickness of 0.1~10 µm.

4. The connection structure according to claim 1, wherein the solder contains Sn and Zn at a eutectic alloy ratio.

5. The connection structure according to claim 1, wherein the solder has a composition of Sn:Zn:Bi=85~95:8~12:1~10.

6. The connection structure according to claim 1, wherein the first conductor comprises a Cu layer, an Ni layer and said Au layer in lamination.

7. A method for connecting, via a solder, a first conductor to a second conductor which is conductive at least at a surface thereof, the first conductor having a surface formed with an Au layer, the solder being Pb-free and Cu-free, and comprising Sn and Zn;
    the method including the steps of interposing the solder between the first conductor and the second conductor, melting the solder to form an Au—Zn alloy layer between the solder and the first conductor acting as a barrier against diffusion of Au from the Au layer to the solder, and then solidifying the solder,
    wherein the solder further contains Bi.

8. The connecting method according to claim 7, wherein the solder is an Sn—Zn eutectic solder.

9. The connecting method according to claim 7, wherein solder has a composition of Sn:Zn:Bi=85~95:8~12:1~10.

10. The connecting method according to claim 7, wherein the Au layer has a thickness of 0.1~10 µm.

11. The connecting method according to claim 7, further comprising the step of forming the Au layer by electrolytic plating prior to the step of interposing the solder between the first conductor and the second conductor.

12. The connecting method according to claim 7, wherein the first conductor comprises a Cu layer, an Ni layer and said Au layer in lamination.

13. The connecting method according to claim 7, wherein the first conductor is a terminal pad of a circuit board, whereas the second conductor is a terminal of an electronic component or a conductor plate.

* * * * *